(12) United States Patent
Wang et al.

(10) Patent No.: US 7,816,775 B2
(45) Date of Patent: Oct. 19, 2010

(54) MULTI-DIE IC PACKAGE AND MANUFACTURING METHOD

(75) Inventors: Chuen Khiang Wang, Singapore (SG); Hao Liu, Singapore (SG); Hien Boon Tan, Singapore (SG); Clifton Teik Lyk Law, Singapore (SG); Rahamat Bidin, Singapore (SG); Anthony Yi Sheng Sun, Singapore (SG)

(73) Assignee: United Test and Assembly Center Limited, Singapore (SG)

( * ) Notice: Subject to any disclaimer, the term of this patent is extended or adjusted under 35 U.S.C. 154(b) by 104 days.

(21) Appl. No.: 11/662,431

(22) PCT Filed: Sep. 9, 2005

(86) PCT No.: PCT/SG2005/000310

§ 371 (c)(1),
(2), (4) Date: Aug. 22, 2007

(87) PCT Pub. No.: WO2006/028421

PCT Pub. Date: Mar. 16, 2006

(65) Prior Publication Data

US 2008/0150103 A1    Jun. 26, 2008

(51) Int. Cl.
*H01L 23/02*    (2006.01)

(52) U.S. Cl. ............... 257/686; 257/666; 257/777; 257/783; 257/E25.006; 257/E25.013; 257/E25.021; 257/E25.027; 257/E23.085

(58) Field of Classification Search ......... 257/666–667, 257/686, 723, 777, 783; 438/123
See application file for complete search history.

(56) References Cited

U.S. PATENT DOCUMENTS

| | | | | |
|---|---|---|---|---|
| 5,780,925 A * | 7/1998 | Cipolla et al. | | 257/676 |
| 5,812,381 A * | 9/1998 | Shigeta et al. | | 361/813 |
| 6,036,173 A * | 3/2000 | Neu et al. | | 257/668 |
| 6,072,243 A * | 6/2000 | Nakanishi | | 257/783 |
| 6,635,138 B1 * | 10/2003 | Choi | | 156/230 |
| 7,215,008 B2 * | 5/2007 | Kim et al. | | 257/666 |

* cited by examiner

*Primary Examiner*—Jasmine J Clark
(74) *Attorney, Agent, or Firm*—Martine Penilla & Gencarella, LLP (57) ABSTRACT

A method for of manufacturing integrated circuit packages and a multi-chip integrated circuit package are disclosed. According to the method, a first die is attached onto a first side of a set of leads of a leadframe, and an adhesive is applied onto the set of leads at a second side opposite to the first side. A second die is attached onto the adhesive. The adhesive fills into the gaps defined by the set of leads. The adhesive is thereafter cured. In a multi-chip integrated circuit package made according to the method, the adhesive attaching the second die fills the gaps between the leads so that to avoid formation of internal cavities of the package.

14 Claims, 9 Drawing Sheets

MULTI-DIE IC PACKAGE AND MANUFACTURING METHOD

FIELD OF INVENTION

The present invention relates to semiconductor Integrated Circuits (IC) structure and method of manufacturing. In particular, it relates to Integrated Circuits packages having multiple dies and a method of manufacturing of the same.

BACKGROUND OF INVENTION

ICs having multiple dies or chips made in a single package increase the capacity of the package without substantially increasing the overall size or dimension of the package. In one example, two or more memory chips may be encapsulated in a single package so as to double or increase the memory capacity of the package without doubling or multiplying the physical size/dimension of the package.

One approach is disclosed in U.S. Pat. No. 6,498,391 namely, a dual-chip integrated circuit package with unaligned chip arrangement and a method of manufacturing such a package. According to this patent, both chips are mounted to a leadframe simply by an insulative adhesive layer covering the full mounting area of each chip.

Mounting a chip onto a leadframe in the above manner may cause problems. For example, since the adhesive is formed as a layer between the leadframe and each chip, there left voids, gaps and/or cavities between the lead portions, which are sandwiched between the adhesive layers. These voids, gaps and/or cavities, within which air may be trapped, are sources of potential device failure.

In view of the foregoing, it is desirable to provide an Integrated Circuits package structure having stacked dies and method of manufacturing of the same, so that to at least partly overcome the drawbacks mentioned above.

SUMMARY

Described herein is a method for of manufacturing integrated circuit packages. The method avoids the drawbacks of conventional methods described above, for example by eliminating the internal cavities/voids, or at least substantially reduces the size thereof, formed in integrated circuit packages by the conventional method. In one aspect, a first die is attached onto a first side of a set of leads of a leadframe, and an adhesive is applied onto the set of leads at a second side opposite to the first side. A second die is attached onto the adhesive. The adhesive fills into the gaps defined by the set of leads. The adhesive is thereafter cured.

In one embodiment, the first die is attached to the first side of the set of leads with a plurality of tape strips. The adhesive further fills the spaces defined by the plurality of tape strips. The adhesive maybe applied at the second side at a first region covering the spaces and a second region covering the plurality of tapes. The adhesive may partially overlap the first region and the second region.

In another embodiment, first die is attached to the set of leads via a single piece of tape, and the single piece of tape separates the adhesive from the first die.

According to a further aspect of the present invention, there is disclosed a multi-chip integrated circuit package, in which a set of leads is disposed in a plane having a first side and an opposite second side, and the set of leads defining a plurality of gaps between each lead. A first die is attached to the set of leads at the first side with a first bond, and a second die is attached to the set of leads at the second side with a second bond. The second bond fills the plurality of gaps.

In one embodiment, the first bond includes a plurality of separated tapes sandwiched between the first die and the set of leads, and the second bond fills the spaces.

In another embodiment, the first bond is a single piece of tape separating the second bond from the first die.

Other aspects and advantages of the present invention will become apparent from the following detailed description, taken in conjunction with the accompanying drawings, illustrating by way of example the inventive concept of the present invention.

BRIEF DESCRIPTION OF THE DRAWINGS

These and other aspects and advantages of the present invention will be described in detail with reference to the accompanying drawings, in which.

DETAILED DESCRIPTION OF THE PREFERRED EMBODIMENTS

Figure 1:
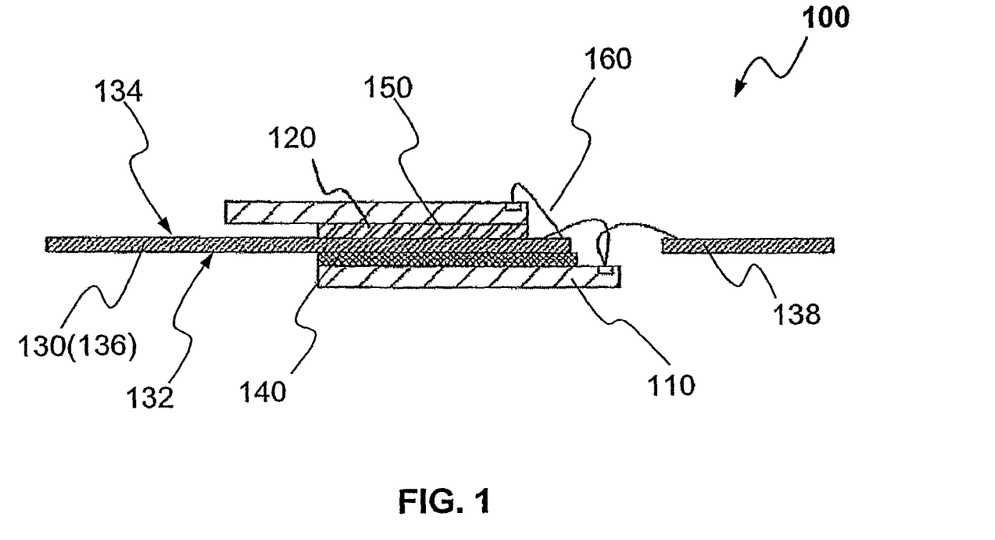
FIG. 1 is a partial cross sectional of a multi-die IC package according to one embodiment of the present invention.
Figure 2:
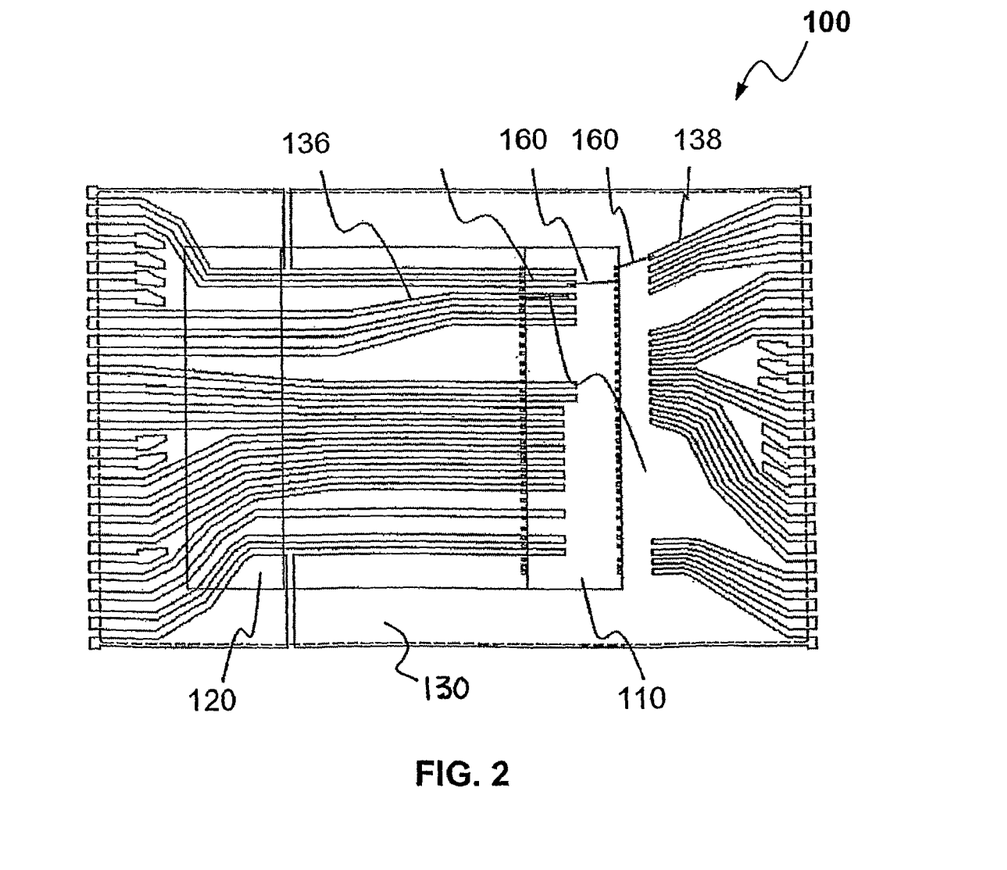
FIG. 2 is a partial top view of FIG. 1.
Figure 3:
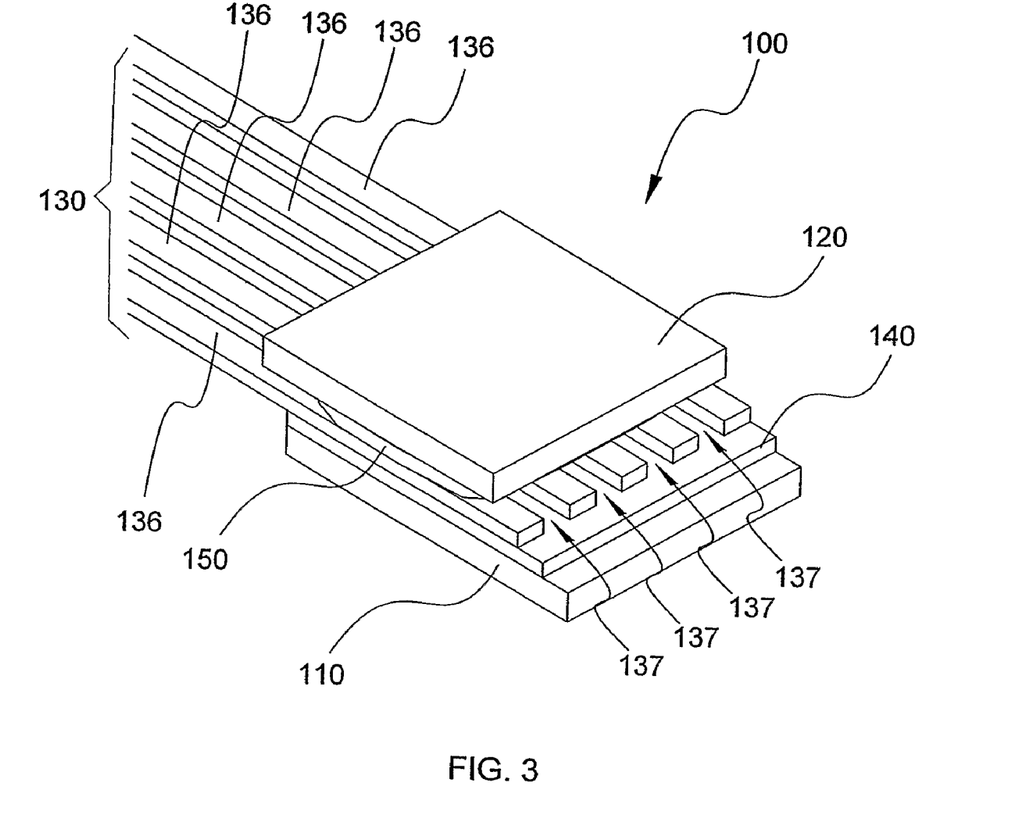
FIG. 3 a partial perspective view of FIG. 1.
Figure 4:
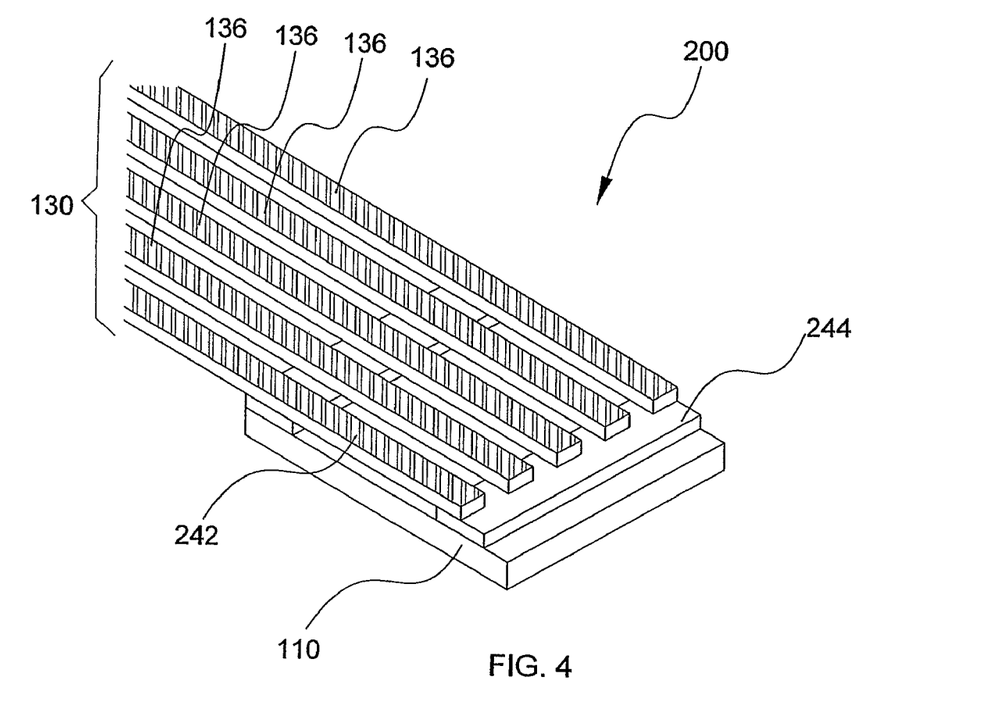
FIG. 4 is a partial perspective view of a multi-die IC package according to another embodiment of the present invention showing a first die attached to the leadframe and prior to attachment of a second die.
Figure 5:
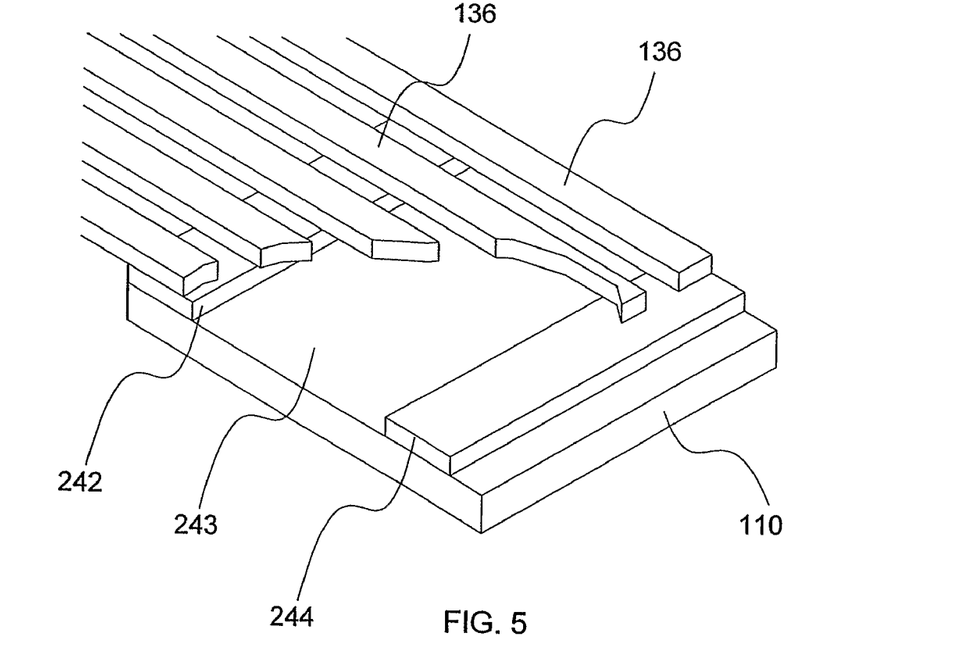
FIG. 5 is an enlarged view of FIG. 4.
Figure 6:
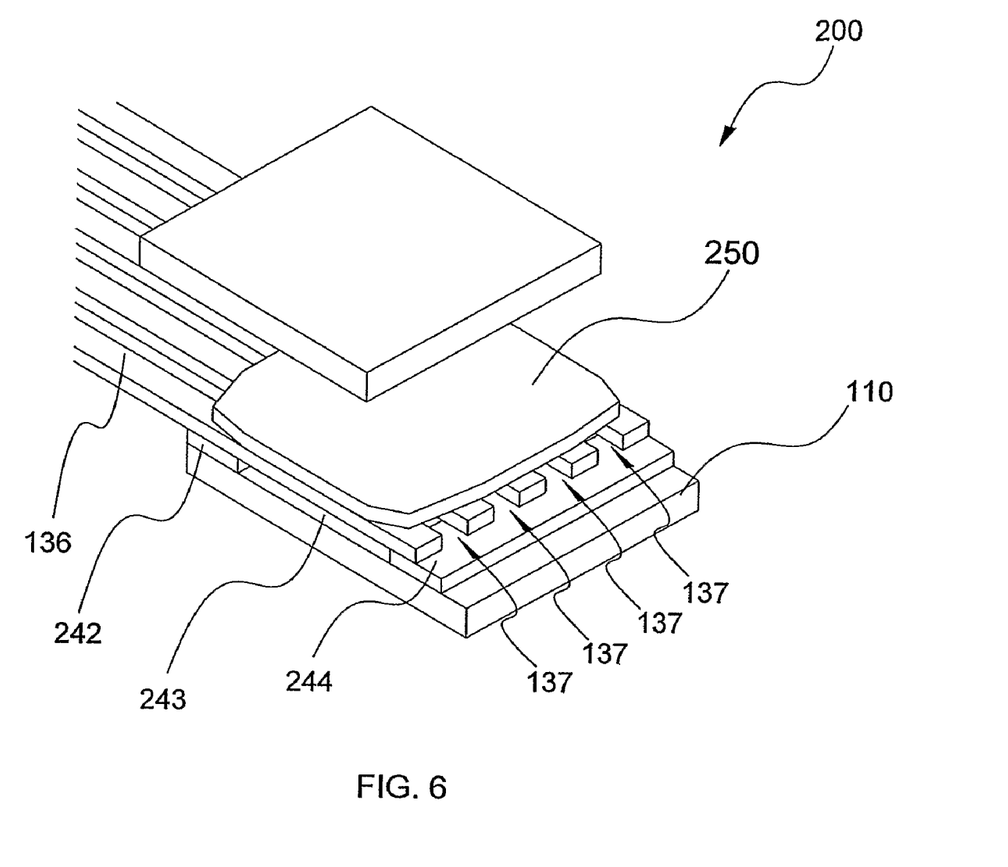
FIG. 6 is a partial perspective view of FIG. 4 showing adhesive applied to the leadframe for attaching the second die.
Figure 7:
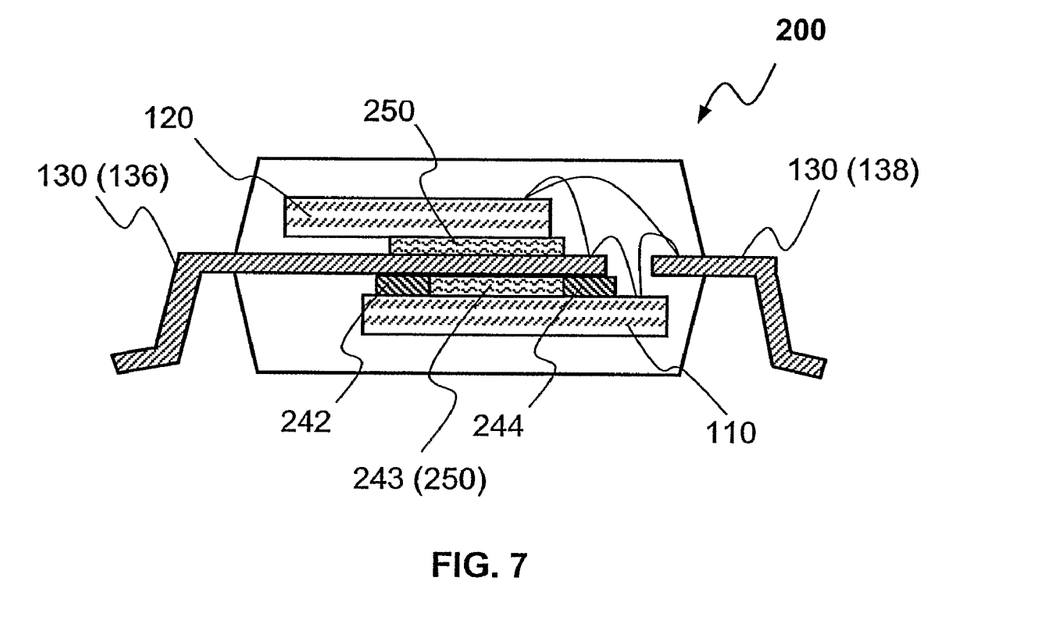
FIG. 7 is a cross sectional view of FIG. 4 showing an encapsulated package.
Figure 8:
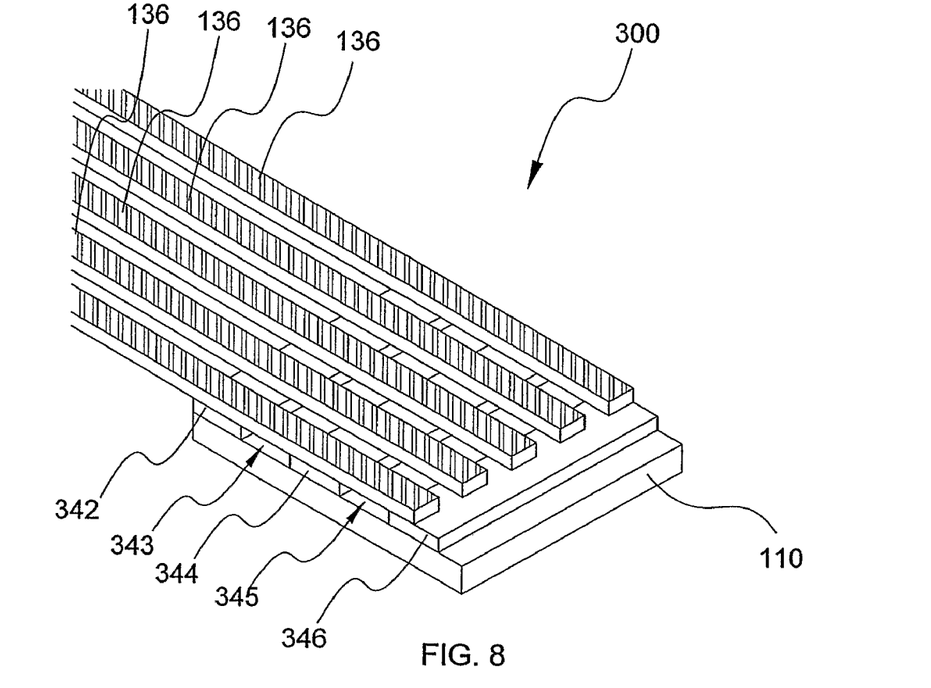
FIG. 8 is a partial perspective view of a multi-die IC package according to a further embodiment of the present invention showing a first die attached to the leadframe and prior to attachment of a second die.
Figure 9:
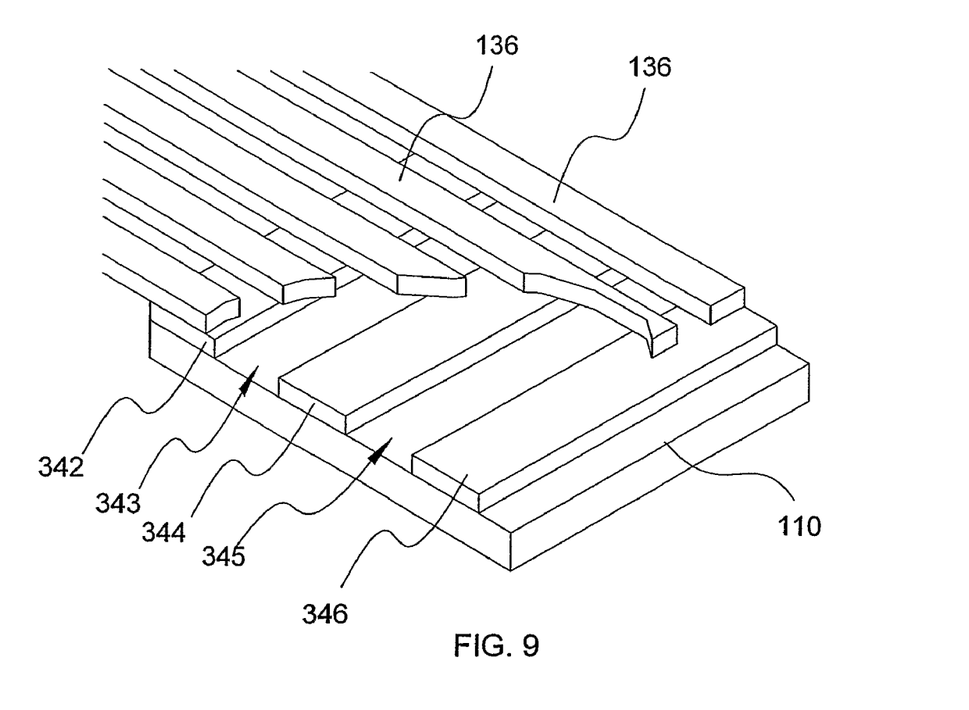
FIG. 9 is an enlarged view of FIG. 8.
Figure 10:
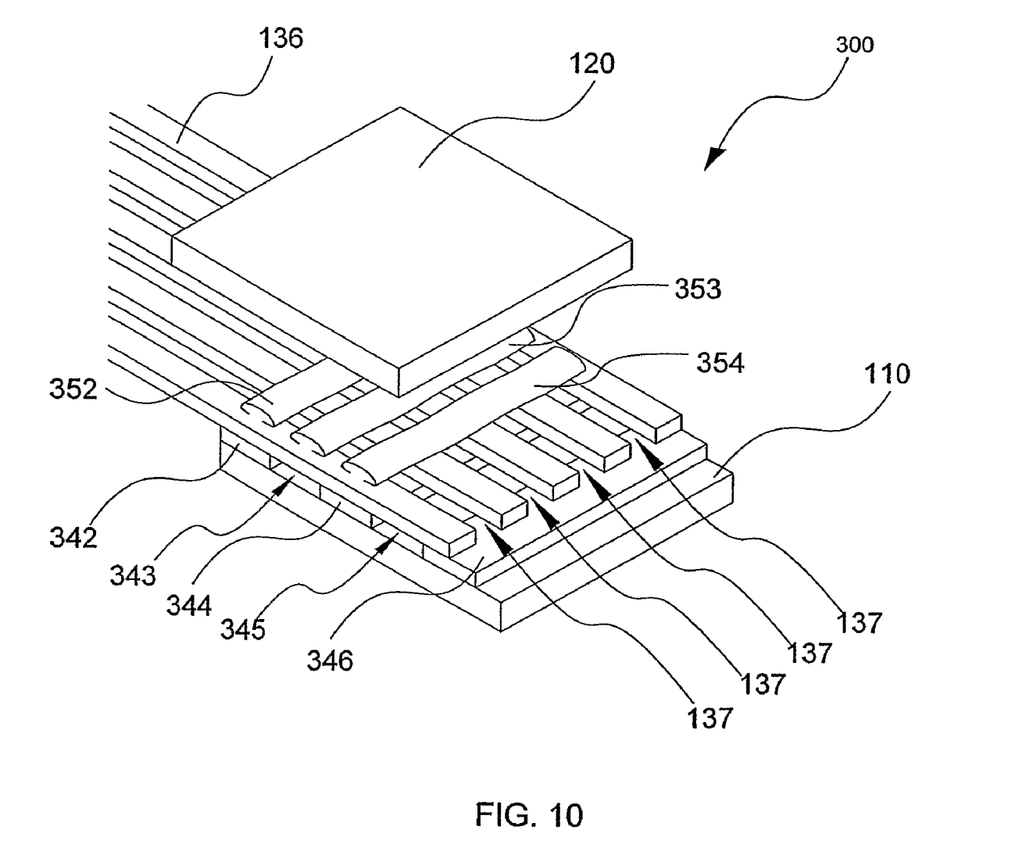
FIG. 10 is a partial perspective view of FIG. 8 showing adhesive applied to the leadframe for attaching the second die.

As shown in FIGS. 1, 2 and 3, a multi-die IC package 100 according to one embodiment of the present invention has a first die 110, a second die 120 and a plurality of long leads 136 of a leadframe 130 onto which first and second dies 110 and 120 are attached. First die 110 is attached to bottom side 132 of leads 136, via a single piece of tape 140. Second die 120 is attached to top side 134 of leads 136, via an adhesive 150. Wire bonds 160 are formed between first and second dies 110, 120 and long leads 136 and short leads 138.

As shown in FIGS. 2 and 3, long leads 136 are disposed spaced apart from each other, defining gaps 137 therebetween. Upon applying adhesive 150, and during attachment of second die 120, adhesive 150 flows to fill gaps 137. Formation of internal cavities is therefore eliminated or, at least the sizes of the internal cavities are substantially reduced in multi-die IC packages.

FIGS. 4 to 7 show a multi-die IC package 200 according to another embodiment of the present invention. IC package 200 is different from IC package 100 in that, instead of providing a single piece of tape to attach first die to the leads, IC package 200 has two tape strips 242 and 244, disposed spaced-apart from each other. Tape strips 242 and 244 therefore define a space 243 therebetween, and both serve the purpose of attaching first die 110 to leads 136.

Upon applying adhesive 250, and/or during attachment of second die 120, adhesive 250 flows to fill gaps 137. Further, adhesive 250 also flows to fill space 243. Internal cavities of the package are therefore avoided or, at least the sizes of the internal cavities are substantially reduced in multi-die IC packages.

During actual production process, leads 136 may not be perfectly disposed within a plane as designed. Using separate tape strips 242 and 244 helps accommodate to the actual uncoplanar situation of the leads, hence eases the process and/or operation to attach the tape strips and first die to leads 136.

FIGS. 8-11 show a multi-die IC package 300 according to a further embodiment of the present invention. FIG. 12 shows the package with adhesive dispensed on the leads for attaching the second die. IC package 300 differentiates from IC packages 100 and 200 in that, three tape strips 342, 344 and 346 are disposed spaced-apart from each other, to attach first die 110 to leads 136. Tape strips 342, 344 and 346 therefore define spaces 343 and 345 therebetween.

Figure 11:
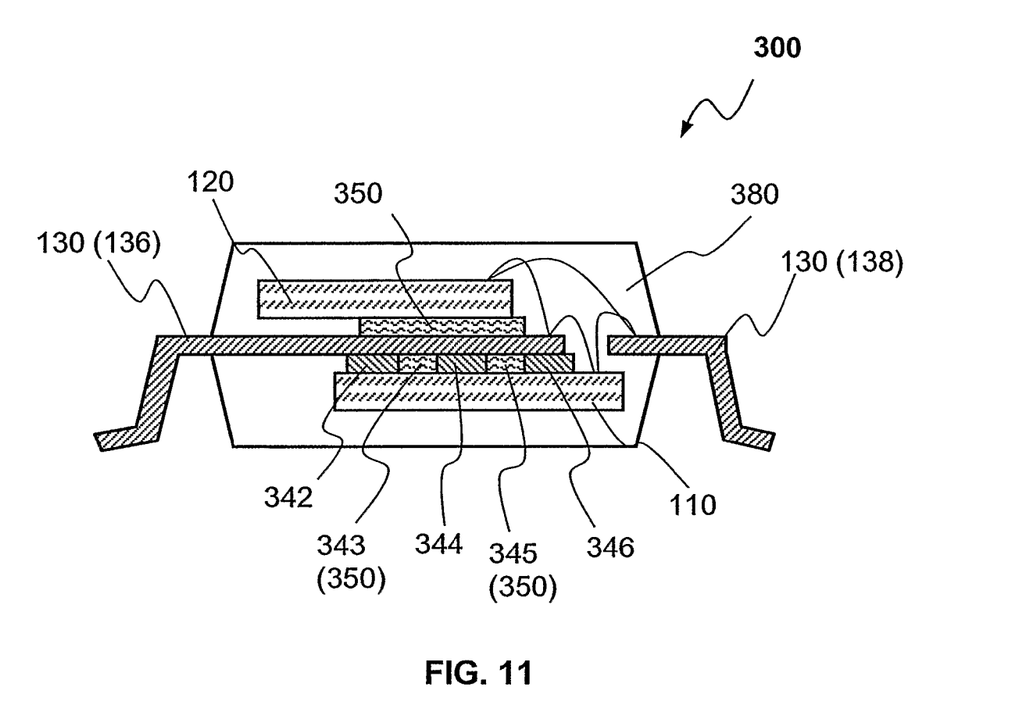
FIG. 11 is a cross sectional view of FIG. 8 showing an encapsulated package.
Figure 12:
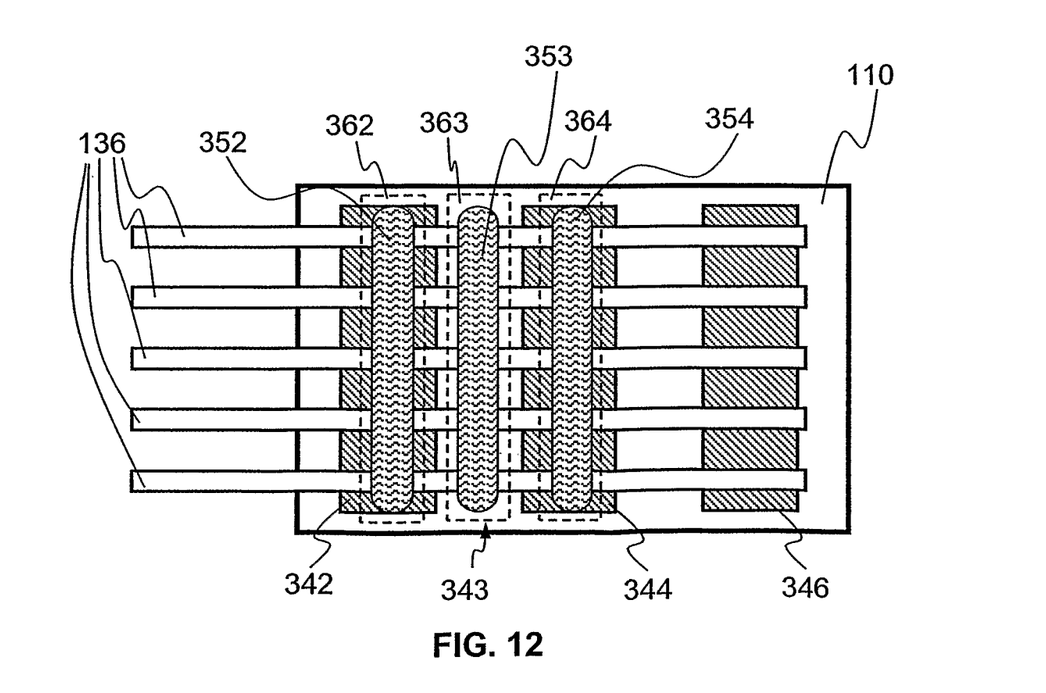
FIG. 12 is a partial cross sectional top view of FIG. 8 showing adhesive dispensed on leads for attaching the second die.

Adhesive is applied in the form of separate strips 352, 353 and 354, at locations opposite to first tape stripe 342, first space 343 and second tape strip 344, respectively, as shown in FIGS. 11 and 12. Adhesive strip 353 may be applied or dispensed within first region 363 which overlaps space 343, adhesive strips 352 and 354 may be applied or dispensed within second region 362, 364 which overlaps tape strips 342 and 344. Adhesive strip 353 may be applied with a volume greater than that of adhesive strips 352 and 354, thus providing a sufficient amount to fill both the gaps 137 and space 343. During attachment of second die 120, adhesive strips 352, 353 and 354 flow to fill gaps 137. Further, adhesive strips 352, 353 and 354 also flow to fill space 343. Internal cavities in the package are therefore avoided or, at least the sizes of the internal cavities are substantially reduced in multi-die IC packages. It should be appreciated that in this embodiment, space 345 will be filled by encapsulant 380 during the subsequent molding/encapsulation process.

Using separate tape strips 342 and 344 helps accommodate to the actual uncoplanar situation of the leads, hence eases the process and/operation to attach the tape strips and first die to leads 136. A multi-die IC package configured according to this embodiment has a further advantage in that since the spaces between the tape stripes are narrowed, by providing three tape strips, dispensing of adhesive strips 352, 353 and 354 becomes easy to control. This eliminates or at least reduces the possibility of contaminating surrounding package areas during adhesive dispensing.

Figure 13:
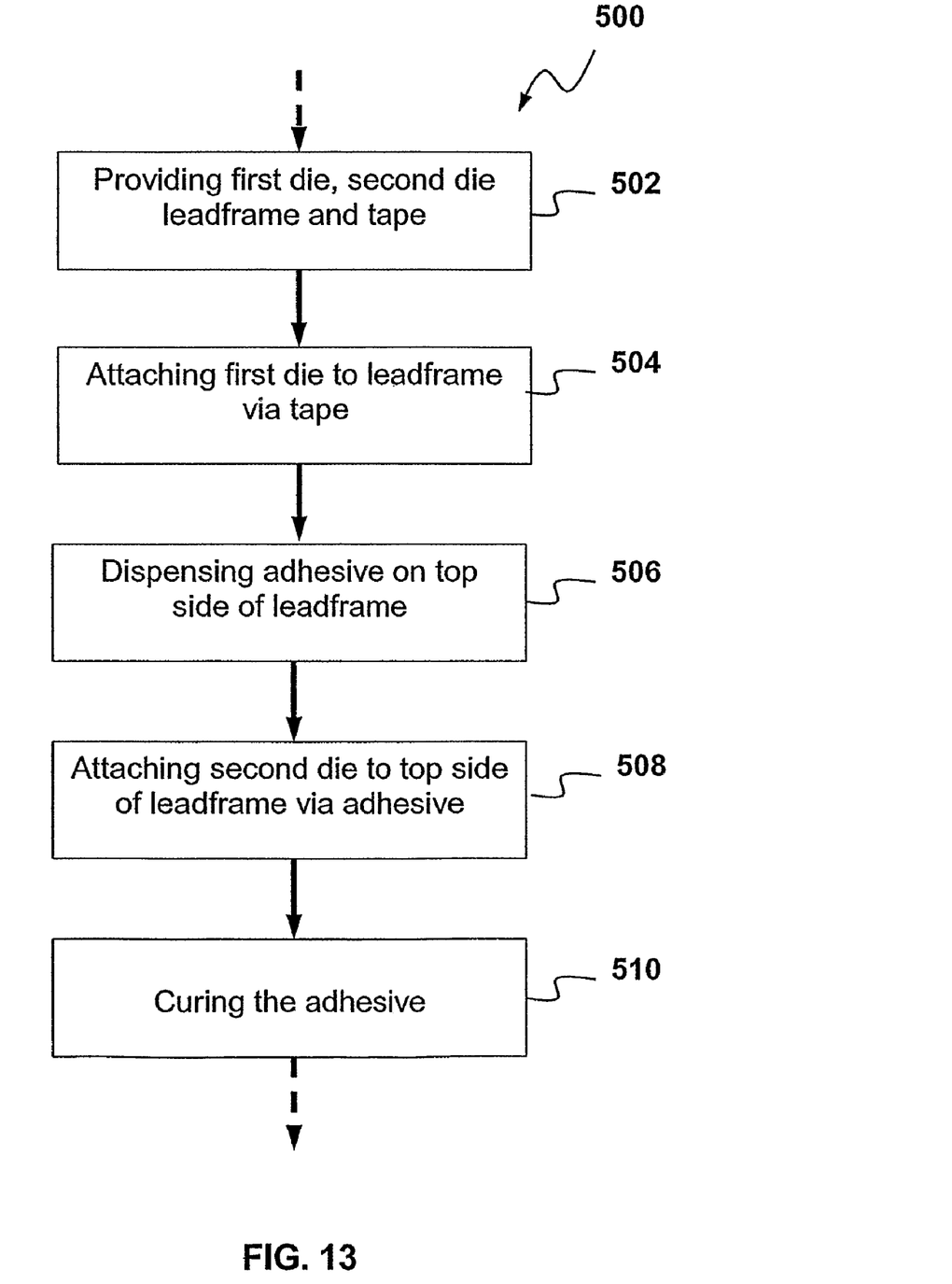
FIG. 13 is a flowchart showing a method according to an embodiment of the present invention.

FIG. 13 is a flow chart showing a method of manufacturing integrated circuit packages according an embodiment of the present invention. Under block 502, first and second dies as well as leadframe are provided. First die is then attached to bottom side of leadframe, as shown in block 504, via one or more pieces of tapes. Thereafter, adhesive is applied or dispensed at top side of the leadframe, shown in block 506. The second die is then attached to the adhesive, shown in block 508. During the dispensing and/or second die attachment, the adhesive flows to fill the gaps between the leads. Should two or more tape strips are used, for example to make devices shown in FIGS. 7 and 12, the adhesive also flows into the spaces between the two or more tape strips. As these gaps and/or spaced are filled by the adhesive, fully or at least partly, the internal cavity or void within the package is eliminated, or at least substantially reduced. IC packages formed according to the above method therefore are more reliable that that formed by conventional method.

After the second die is attached, the adhesive is cured so as to form a bond between the first die, the leadframe and the second die, as shown in block 510. The package is now ready to undergo further processes, such as wire bonding, molding/encapsulation, trimming, plating and marking, etc. so as to form the final IC device.

Although embodiments of the present invention have been illustrated in conjunction with the accompanying drawings and described in the foregoing detailed description, it should be appreciated that the invention is not limited to the embodiments disclosed, and is capable of numerous rearrangements, modifications, alternatives and substitutions without departing from the spirit of the invention as set forth and recited by the following claims.

The invention claimed is:

1. A method of manufacturing integrated circuit packages, comprising:
   attaching a first die onto a first side of a set of leads;
   applying an adhesive onto the set of leads at a second side opposite to the first side, wherein the adhesive is to fill into gaps defined by the set of leads;
   attaching a second die onto the adhesive; and
   curing the adhesive, wherein the first die is attached to the first side of the set of leads with a plurality of tape strips.

2. The method as recited in claim 1, wherein the plurality of tape strips define a plurality of spaces, and wherein the adhesive fills the spaces prior to curing the adhesive.

3. The method as recited in claim 2, wherein the adhesive is in contact with the first die.

4. The method as recited in claim 1, wherein the adhesive is applied at the second side at a first region overlapping the spaces and a second region overlapping the plurality of tapes.

5. The method as recited in claim 4, wherein the adhesive partially covers the first region and the second region.

6. A method of manufacturing integrated circuit packages, comprising:
   attaching a first die onto a first side of a set of leads;
   applying an adhesive onto the set of leads at a second side opposite to the first side, wherein the adhesive is to fill into gaps defined by the set of leads;
   attaching a second die onto the adhesive; and
   curing the adhesive, wherein the first die is attached to the set of leads via a single piece of tape, and wherein the single piece of tape separates the adhesive from the first die.

7. The method as recited in claim 6, wherein the adhesive is in contact with the single piece of tape.

8. An integrated circuit package, comprising:
   a set of leads disposed in a plane having a first side and an opposite second side, the set of leads defining a plurality of gaps between each lead;
   a first die attached to the set of leads at the first side with a first bond;
   a second die attached to the set of leads at the second side with a second bond;
   wherein the second bond is to fill the plurality of gaps.

9. The integrated circuit package as recited in claim 8, wherein the first bond comprises a plurality of separated tapes sandwiched between the first die and the set of leads.

10. The integrated circuit package as recited in claim 9, wherein the plurality of tapes are separated from each other forming spaces therebetween.

11. The integrated circuit package as recited in claim 10, wherein the second bond fills the spaces.

12. The integrated circuit package as recited in claim 8, wherein the first bond is a single piece of tape separating the second bond from the first die.

13. The integrated circuit package as recited in claim 12, wherein the second bond is in contact with the single piece of tape.

14. The integrated circuit package as recited in claim 8, further comprising an encapsulation to cover the first die, the second die and a portion of the leads.

* * * * *